United States Patent
Jacobsen

(10) Patent No.: US 7,559,486 B2
(45) Date of Patent: Jul. 14, 2009

(54) APPARATUSES AND METHODS FOR FORMING WIRELESS RF LABELS

(75) Inventor: Jeffrey Jay Jacobsen, Hollister, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 208 days.

(21) Appl. No.: 11/641,455

(22) Filed: Dec. 18, 2006

(65) Prior Publication Data

US 2007/0115645 A1 May 24, 2007

Related U.S. Application Data

(63) Continuation of application No. 09/932,644, filed on Aug. 17, 2001, now Pat. No. 7,218,527.

(51) Int. Cl.
*E01B 9/00* (2006.01)
*H05K 7/00* (2006.01)

(52) U.S. Cl. .............. 238/365; 361/737; 385/2; 385/4; 385/8; 385/14

(58) Field of Classification Search .......... 238/385; 361/737; 385/2, 4, 8, 14, 15, 42
See application file for complete search history.

(56) References Cited

U.S. PATENT DOCUMENTS

| | | | |
|---|---|---|---|
| 5,011,066 A | 4/1991 | Thompson | |
| 5,087,877 A | 2/1992 | Frentz et al. | |
| 5,138,433 A | 8/1992 | Hiruta | |
| 5,222,014 A | 6/1993 | Lin | |
| 5,247,423 A | 9/1993 | Lin et al. | |
| 5,258,648 A | 11/1993 | Lin | |
| D343,261 S | 1/1994 | Eberhardt et al. | |
| D353,343 S | 12/1994 | Eberhardt et al. | |
| 5,378,880 A | 1/1995 | Eberhardt | |
| 5,382,784 A | 1/1995 | Eberhardt | |
| 5,420,757 A | 5/1995 | Eberhardt et al. | |
| 5,438,224 A | 8/1995 | Papageorge et al. | |

(Continued)

FOREIGN PATENT DOCUMENTS

WO WO 97/05556 2/1997

(Continued)

OTHER PUBLICATIONS

"BiStatix ™ Technology", A Whitepaper, Version 4.1, Motorola Inc. Worldwide Smartcard Solutions Division, Mar. 1999, 11pp.

*Primary Examiner*—Howard Weiss
*Assistant Examiner*—Steven H Rao
(74) *Attorney, Agent, or Firm*—Blakely, Sokoloff, Taylor & Zafman LLP

(57) ABSTRACT

Apparatuses and methods for forming wireless RF labels are claimed. In one embodiment, a flexible layer may be made to receive an array of integrated circuit chips The integrated circuit chips may be powered by a signal from a transmitter which beams the information to the wireless RF labels. The method includes coupling a plurality of integrated circuit chips to a flexible web material and advancing the flexible web material through a web processing apparatus. A metallization material is patterned on the flexible web material. The flexible web material can be coupled to a second web material.

14 Claims, 20 Drawing Sheets

U.S. PATENT DOCUMENTS

| | | | |
|---|---|---|---|
| 5,469,020 A | 11/1995 | Herrick | |
| 5,491,303 A | 2/1996 | Weiss | |
| 5,528,222 A | 6/1996 | Moskowitz et al. | |
| 5,545,291 A | 8/1996 | Smith et al. | |
| 5,565,706 A | 10/1996 | Miura et al. | |
| D378,578 S | 3/1997 | Eberhardt et al. | |
| 5,664,032 A | 9/1997 | Bischel et al. | |
| 5,714,800 A | 2/1998 | Thompson | |
| 5,733,608 A | 3/1998 | Kessel et al. | |
| 5,734,201 A | 3/1998 | Djennas et al. | |
| 5,736,967 A | 4/1998 | Kayser et al. | |
| 5,742,100 A | 4/1998 | Schroeder et al. | |
| 5,745,775 A | 4/1998 | Ahlm et al. | |
| 5,771,154 A | 6/1998 | Goodman et al. | |
| 5,774,341 A | 6/1998 | Urbish et al. | |
| 5,810,959 A * | 9/1998 | Tanaka et al. | 156/275.5 |
| 5,861,817 A | 1/1999 | Palmer et al. | |
| 5,912,507 A | 6/1999 | Dunn et al. | |
| 5,975,416 A | 11/1999 | Chow et al. | |
| 5,975,417 A | 11/1999 | Spencer et al. | |
| 6,015,970 A | 1/2000 | Guzik et al. | |
| 6,018,299 A | 1/2000 | Eberhardt | |
| 6,022,761 A | 2/2000 | Grupen-Shemansky et al. | |
| 6,040,624 A | 3/2000 | Chambers et al. | |
| 6,040,773 A | 3/2000 | Vega | |
| 6,046,910 A | 4/2000 | Ghaem et al. | |
| 6,077,282 A * | 6/2000 | Shturman et al. | 606/159 |
| 6,091,332 A | 7/2000 | Eberhardt et al. | |
| 6,094,138 A | 7/2000 | Eberhardt et al. | |
| 6,104,291 A | 8/2000 | Beauvillier et al. | |
| 6,107,920 A | 8/2000 | Eberhardt et al. | |
| 6,108,212 A | 8/2000 | Lach et al. | |
| 6,113,728 A * | 9/2000 | Tsukagoshi et al. | 156/264 |
| 6,147,605 A | 11/2000 | Vega et al. | |
| 6,147,662 A | 11/2000 | Grabau et al. | |
| 6,236,316 B1 | 5/2001 | Eberhardt et al. | |
| 6,246,327 B1 | 6/2001 | Eberhardt et al. | |
| 6,252,508 B1 | 6/2001 | Vega et al. | |
| 6,253,190 B1 | 6/2001 | Sutherland | |
| 6,265,977 B1 | 7/2001 | Vega et al. | |
| 6,269,342 B1 | 7/2001 | Brick et al. | |
| 6,271,807 B1 | 8/2001 | Kayser et al. | |
| 6,275,681 B1 | 8/2001 | Vega et al. | |
| 6,282,407 B1 | 8/2001 | Vega et al. | |
| 6,309,912 B1 | 10/2001 | Chiou et al. | |
| 6,312,304 B1 * | 11/2001 | Duthaler et al. | 445/24 |
| 6,362,516 B1 | 3/2002 | Waters | |
| 6,417,025 B1 | 7/2002 | Gengel | |
| 6,468,638 B2 | 10/2002 | Jacobsen et al. | |
| 6,514,790 B1 | 2/2003 | Plettner et al. | |
| 6,523,734 B1 | 2/2003 | Kawai et al. | |
| 6,527,964 B1 | 3/2003 | Smith et al. | |
| 6,606,247 B2 | 8/2003 | Credelle et al. | |
| 6,612,889 B1 * | 9/2003 | Green et al. | 445/24 |
| 6,779,733 B2 | 8/2004 | Akita et al. | |
| 6,891,110 B1 | 5/2005 | Pennaz et al. | |
| 6,897,562 B2 | 5/2005 | Mercado et al. | |
| 6,951,596 B2 | 10/2005 | Green et al. | |
| 2002/0098526 A1 * | 7/2002 | Bamdad | 435/7.9 |
| 2002/0149107 A1 | 10/2002 | Chang et al. | |
| 2003/0036249 A1 | 2/2003 | Bauer et al. | |

FOREIGN PATENT DOCUMENTS

| | | |
|---|---|---|
| WO | WO 00/52109 | 9/2000 |
| WO | WO 02/49093 | 6/2002 |

* cited by examiner

APPARATUSES AND METHODS FOR FORMING WIRELESS RF LABELS

This application is a continuation application of U.S. patent application Ser. No. 09/932,644, filed Aug. 17, 2001, now U.S. Pat. No. 7,218,527 entitled "Apparatus and Methods for Forming Smart Labels" and which is herein incorporated by reference in its entirety.

FIELD OF THE INVENTION

The present invention relates generally to electronic assemblies. More particularly, the present invention relates to apparatuses and methods for forming displays that are alterable and configurable based upon data that is received from a transmitter.

DESCRIPTION OF RELATED ART

Display panels are used in a variety of devices to convey information. Display panels may be comprised of active matrix or passive matrix panels. Active matrix and passive matrix panels may be either transmissive or reflective. Transmissive displays include both polysilicon thin-film transistor (TFT) displays and high-resolution polysilicon displays. Reflective displays typically comprise single crystal silicon integrated circuit substrates which have reflective pixels.

Liquid crystals, electroluminescent (EL) materials, organic light emitting diodes (OLEDs), upconverting and downconverting phosphor (U/DCP), electrophoretic (EP) materials, or light emitting diodes (LEDs) may be used in fabricating flat-panel display panels. Each of these is known in the art and is discussed briefly below. Liquid crystal displays (LCDs) may have an active matrix backplane in which thin-film transistors are co-located with LCD pixels. Flat-panel displays employing LCDs generally include five different components or layers: a White or sequential Red, Green, Blue light source, a first polarizing filter that is mounted on one side of a circuit panel on which the TFTs are arrayed to form pixels, a filter plate containing at least three primary colors arranged into pixels, and a second polarizing filter. The volume between the circuit panel and the filter plate is filled with a liquid crystal material. This material will rotate the polarized light when an electric field is applied between the circuit panel and a transparent ground electrode affixed to the filter plate or a cover glass. Thus, when a particular pixel of the display is turned on, the liquid crystal material rotates polarized light being transmitted through the material so that it will pass through the second polarizing filter. Some liquid crystal materials, however, require no polarizers. LCDs may also have a passive matrix backplane which usually consists of two planes of strip electrodes which sandwich the liquid crystal material. However, passive matrices generally provide a lower quality display compared to active matrices. Liquid crystal material includes but is not limited to twisted nematic (TN), super TN (STN), double STN, and ferroelectric. U/DCP and EP displays are formed in a similar fashion except that the active medium is different (e.g., upconverting gas, downconverting gas, electrophoretic materials).

EL displays have one or more pixels which are energized by an alternating current (AC) which must be provided to each pixel by row and column interconnects. EL displays generally provide a low brightness output because passive circuitry for exciting pixel phosphors typically operates at a pixel excitation frequency which is low relative to the luminance decay time of the phosphor material. However, an active matrix reduces the interconnect capacitance allowing the use of high frequency AC in order to obtain more efficient electroluminescence in the pixel phosphor. This results in increased brightness in the display.

LED displays are also used in flat-panel displays. LEDs emit light when energized. OLEDs operate like the LEDs except that OLEDs use organic material in the formation of the diode.

Regardless of the type of active medium used, displays are generally comprised of at least a substrate and a backplane. The backplane forms the electrical interconnection of the display and comprises, in one example, electrodes, capacitors, and transistors in at least some embodiments of a backplane.

FIG. 1A illustrates a rigid display device wherein the active matrix display backplane 10 is coupled to a rigid substrate 12. Typically, the active matrix display backplane is also rigid. FIG. 1B shows another rigid display. There, the active matrix display backplane 10 is coupled to a rigid substrate 12 (e.g., glass). Also shown is a plurality of blocks 14. These blocks may be fabricated separately and then deposited into holes on substrate 12 by a process known as fluidic self-assembly (FSA). An example of the FSA process is described in U.S. Pat. No. 5,545,291 issued to Stephen J. Smith, et al. These blocks may each contain driver circuitry (e.g., MOSFET and capacitor) for driving a pixel electrode. The active matrix backplane includes transparent pixel electrodes and row/column interconnects (not shown) to electrically interconnect the blocks 14. The plurality of blocks 14 is coupled to the active matrix display backplane 10 and the rigid substrate 12. FIG. 1C shows a reflective display 16 coupled to a rigid substrate 12. FIG. 1D shows a reflective display 16 coupled to a rigid substrate 12. A plurality of blocks 14 is coupled to the reflective display 16 and to the rigid substrate 12.

Placing elements, such as pixel drivers, on a rigid substrate is well known. Prior techniques can be generally divided into two types: deterministic methods or random methods. Deterministic methods, such as pick and place, use a human or robot arm to pick each element and place it into its corresponding location in a different substrate. Pick and place methods generally place devices one at a time and are generally not applicable to very small or numerous elements such as those needed for large arrays, such as an active matrix liquid crystal display.

Random placement techniques are more effective and result in high yields if the elements to be placed have the right shape. U.S. Pat. No. 5,545,291 describes a method which uses random placement. In this method, microstructures are assembled onto a different substrate through a fluid transport such FSA. Using this technique, various blocks, each containing a functional component, may be fabricated on one substrate and then separated from that substrate and assembled onto a separate rigid substrate through the FSA process.

As noted above, FIGS. 1B and 1D illustrate a display substrate 12 with blocks 14 formed in the rigid substrate 12. These blocks 14 may be deposited through an FSA process. In the FSA process, a slurry containing the blocks 14 is deposited over the rigid substrate 12 and the blocks 14 rest in corresponding openings in the substrate 12.

FIG. 2 shows a planar side view of a rigid substrate coupled to a rigid display backplane with a plurality of blocks 14 between the display backplane 30 and substrate 12. The plurality of blocks 14 are functionally part of the display backplane 30 and are deposited onto receptor regions of the substrate 12. Each block drives at least one transparent pixel electrode. The pixel is fabricated over a transistor which is fabricated in the block.

FIG. 3 shows a portion of an array in an active matrix display backplane. The control line rows 31 and 32 in this device are coupled to gate electrodes along a row and the control line columns 34 and 35 are coupled to data drivers which supply pixel voltages which are applied to the pixel electrodes. A column line 34 is connected to a source electrode of field effect transistor (FET) 36. Another column line 35 is coupled to a source electrode of FET 37. A row line 32 is coupled to the gates of both FETs 36 and 37. The drain of FET 36 is coupled through capacitor 38 to a transparent pixel electrode along the row 32 formed by FETs 36 and 37. The drain of FET 37 is coupled through a capacitor to another pixel electrode along the row. In one typical example, the backplane may be formed by depositing blocks, using an FSA technique, into a rigid substrate (e.g., glass); each block contains both a FET and a capacitor and is interconnected to other blocks by column and row conductors which are deposited onto the rigid substrate; and, the capacitor is coupled to a pixel electrode by another conductor which is deposited onto the rigid substrate. The active medium (e.g., a liquid crystal) is deposited at least on the pixel electrodes which will optically change the active medium's properties in response to the combined voltages or currents produced by the pixel electrodes. The active medium at a given pixel electrode 42 will appear as a square or dot in the overall checkerboard type matrix of the display. The actual size of the FETs and the pixel electrodes 42 are not now drawn to scale, but are shown schematically for the purposes of illustration.

The interconnect between the rows and columns is comprised of flexible and conductive material. For example, the interconnect could be made of conductive polymers, metals (e.g., aluminum, copper, silver, gold, etc.), metal particles, teflon with metallic particles, or conductive oxides. FIG. 4 shows pixel electrodes 46 on top of a substrate 49.

FIG. 4 shows a planar side view of a rigid substrate coupled to a rigid display backplane with a plurality of blocks between the display backplane 30 and substrate 12. The plurality of blocks are functionally part of the display backplane 30 and are deposited onto receptor regions of the substrate 12. Each block drives at least one transparent pixel electrode. The pixel is fabricated over a transistor which is fabricated in the block.

Although there are displays which may be electronically updated, these displays are nonetheless limited. For example, U.S. Pat. No. 5,465,085 discloses a display which may be used to update information displayed on labels in a retail store. However, these labels are not manufactured such that the blocks with the circuit elements thereon are placed on a substrate using FSA. Labels in which the circuit elements are placed onto the substrate using deterministic methods reduce productivity.

Another disadvantage to these flat-panel displays is that they are manufactured in a batch operation. Batch operations inherently involve a certain amount of down time in production. This increases aggregate production time to fabricate display panels. Additionally, flat-panel displays are generally fabricated on rigid substrates which are not continuous in length. This also decreases productivity since the assembly of the flat-panel displays is interrupted until another substrate panel is available to assemble the flat-panel display. It is therefore desirable to develop a system and a method that addresses the disadvantages associated with conventional systems and methods.

SUMMARY

The present invention provides various apparatuses and methods for creating displays. In one embodiment, the display may be conformal and that may receive information in order to alter or configure the display. In another embodiment, a flexible layer may be made to receive an array of blocks that drive a display material in order to provide an alterable or configurable display. The receiver (and blocks) may be powered by the signal from a transmitter which beams the information to the receiver. The receiver, in turn, controls the update of the display information on the label.

While an array of components (e.g., display components) for an assembly are described herein as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

BRIEF DESCRIPTION OF THE DRAWINGS

The present invention is illustrated by way of example. The invention is not limited to the figures of the accompanying drawings in which like references indicate similar elements.

DETAILED DESCRIPTION

Figure 1A:
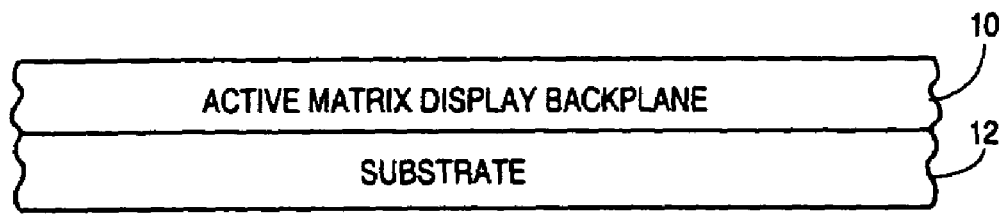
FIG. 1A shows a planar side view of an active matrix display backplane coupled to a rigid substrate of the prior art.
Figure 1B:
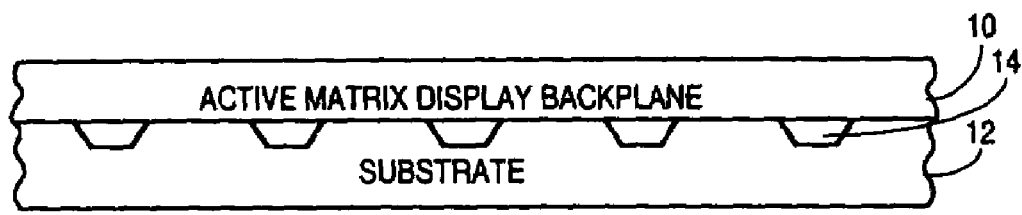
FIG. 1B shows a planar side view of an active matrix display backplane coupled to a rigid substrate wherein a plurality of blocks are part of the active matrix display of the prior art.
Figure 1C:
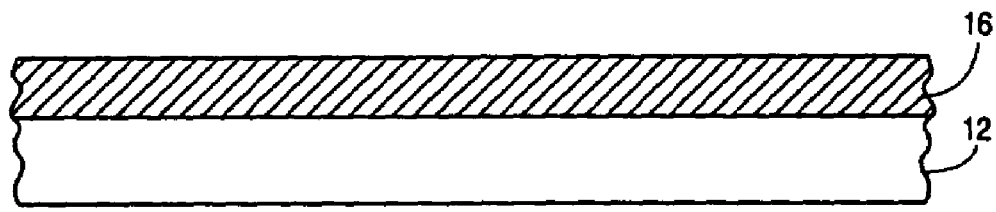
FIG. 1C shows a planar side view of a reflective display backplane coupled to a rigid substrate of the prior art.
Figure 1D:
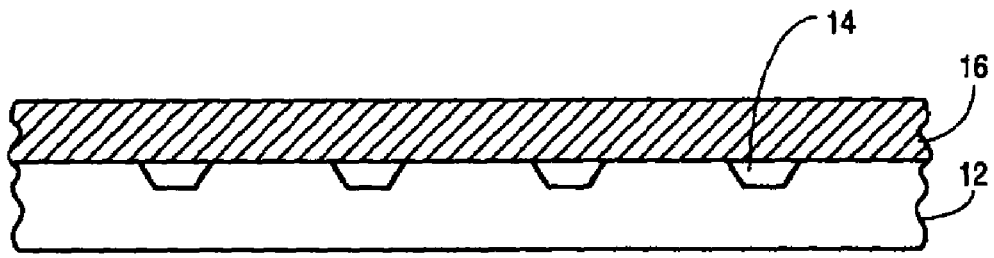
FIG. 1D shows a planar side view of a reflective display backplane coupled to a rigid substrate wherein a plurality of blocks are coupled to the reflective display and to the rigid substrate of the prior art.
Figure 2:
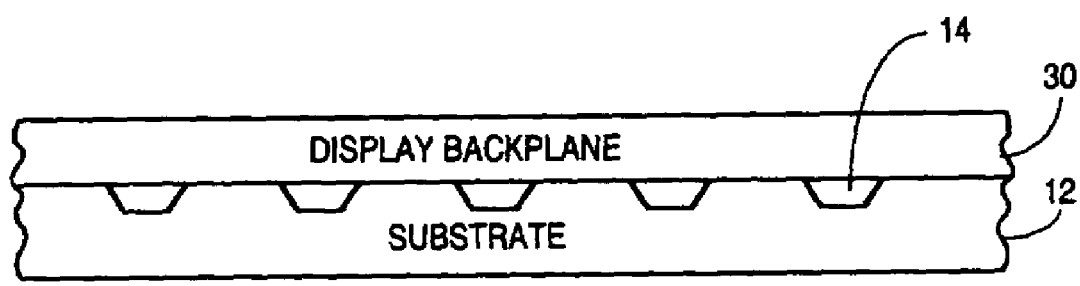
FIG. 2 shows a planar side view of a rigid substrate coupled to a rigid display backplane with a plurality of blocks between the display backplane and substrate of the prior art.
Figure 3:
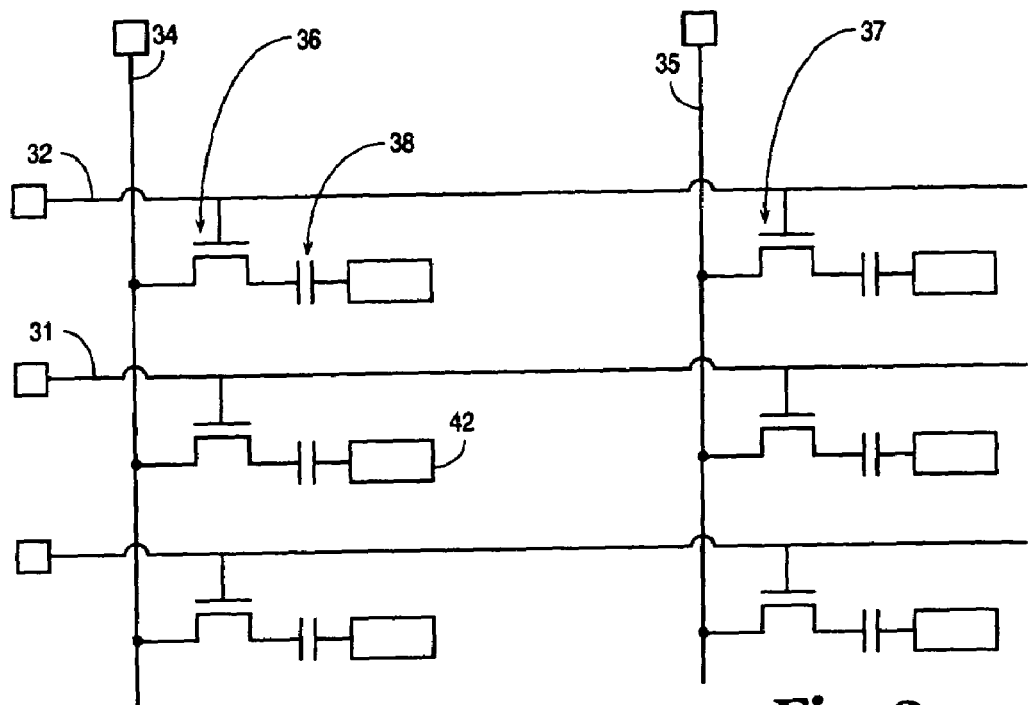
FIG. 3 represents schematically a portion of an array of an active matrix backplane of the prior art.
Figure 4:
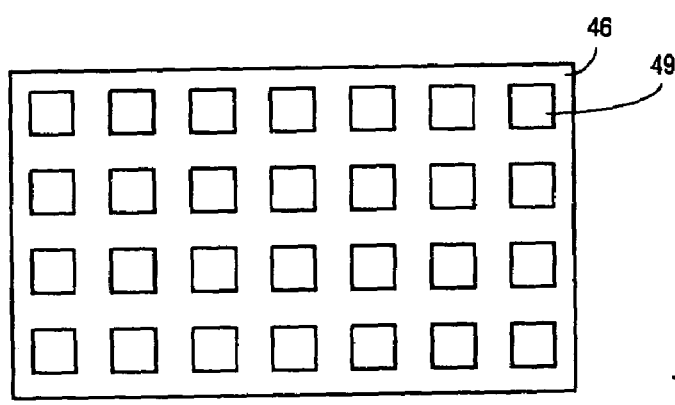
FIG. 4 shows a top view of a plurality of pixel electrodes in a backplane of the prior art.

The present invention relates to apparatuses and methods for forming displays. The following description and drawings are illustrative of the invention and are not to be construed as limiting the invention.

One embodiment of the invention relates to a smart label which has a flexible active matrix display panel coupled to a receiver. By fabricating a smart label which is flexible, the smart label can be fitted to an object which is either flexible or rigid and which has a planar or a non-planar surface. This smart label may then receive signals from a transmitter which updates information displayed on a label. The backplane of the display may be comprised of a plurality of blocks in which each block has a circuit element thereon. The blocks are contained in a slurry which is deposited onto a flexible web material. Although blocks may be comprised of a single crystal silicon or other like material which makes the block rigid, the web material is still flexible because the size of these blocks (50×100 microns or 100×100 microns) is so small in comparison to the size of web material. The flexible web material forms part of a display backplane. The flexible displays may be either an active matrix or a passive matrix displays. It will be appreciated that by using a web material (e.g., length to width ratio of, for example, 80:1, 50:1, 25:1, 10:1, etc.), the fabrication of smart labels has a reduced cost compared to conventional batch processes that are used.

Another embodiment of the invention relates to the blocks having receivers thereon.

Another embodiment of the invention relates to a flexible web material with a reflective display backplane.

Another embodiment of the invention involves using FSA generally with a flexible web processed material. Incorporated by reference is U.S. Pat. No. 5,545,291 explaining how to assemble microstructures onto a substrate.

Another embodiment of the invention relates to the FSA process in which, after the blocks are deposited on the web material, the blocks fall into recessed regions found in the web material. After a certain time period, the web material is checked for any existing empty recessed regions. The web material is checked by an electronic eye secured to a machine which is able to view the surface of the web material. A robot or a person is used to place an object on an empty recessed region.

In the following description, numerous specific details such as specific materials, processing parameters, processing steps, etc., are set forth in order to provide a thorough understanding of the invention. One skilled in the art will recognize that these details need not be specifically adhered in order to practice the claimed invention. In other instances, well known processing steps, materials, etc. are not set forth in order not to obscure the invention.

FIGS. 5A-5E and FIGS. 6A-6E show embodiments of the invention in which web material is able to receive objects. Although these embodiments relate to web material, other flexible or rigid substrates may be used in place of the web material.

Figure 5A:
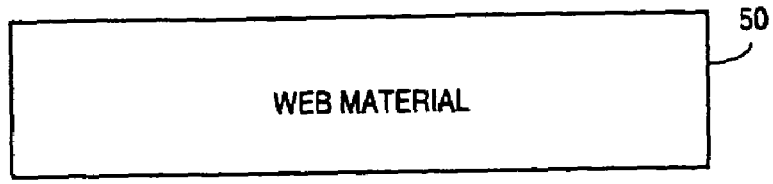
FIG. 5A shows a planar side view of a web material in accordance with one embodiment of the invention.
Figure 5B:
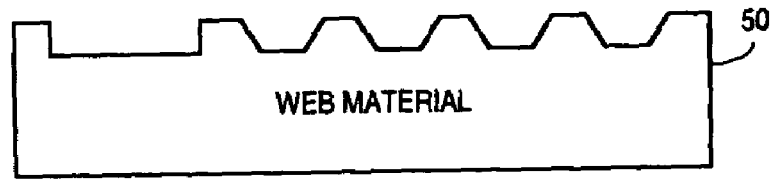
FIG. 5B shows a planar side view of a web material wherein recessed regions are created in the web material in accordance with one embodiment of the invention.
Figure 5C:
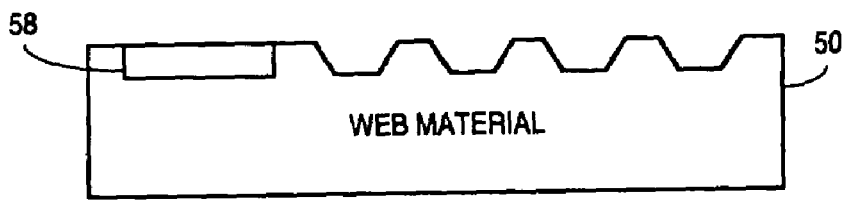
FIG. 5C shows a planar side view of a web material with a receiver coupled thereto in accordance with one embodiment of the invention.

FIGS. 5A-5E show the assembly of one embodiment of a smart label. FIG. 5A shows a web material 50. FIG. 5B shows web material 50 with different sized recessed regions that were made into the web material using a method such as a roller having protruding members. FIG. 5C shows a receiver 58 placed into a recessed region. FSA is used to place the receiver into the recessed regions of the web material. A wireless RF transponder is the preferred type of receiver 58 because it is noncontact and needs only one chip. However, other types of receivers may be used. The receiver operates in a typical fashion and may include a detector, a plurality of amplifiers, a pitch detector, comparator, and a bias generator. The display also may incorporate a power supply that includes both photo-voltaic cell and a power control system that controls power through the lines.

Figure 5D:
FIG. 5D shows the device in FIG. 5C in which blocks are placed onto the web material in accordance with one embodiment of the invention.
Figure 5E:
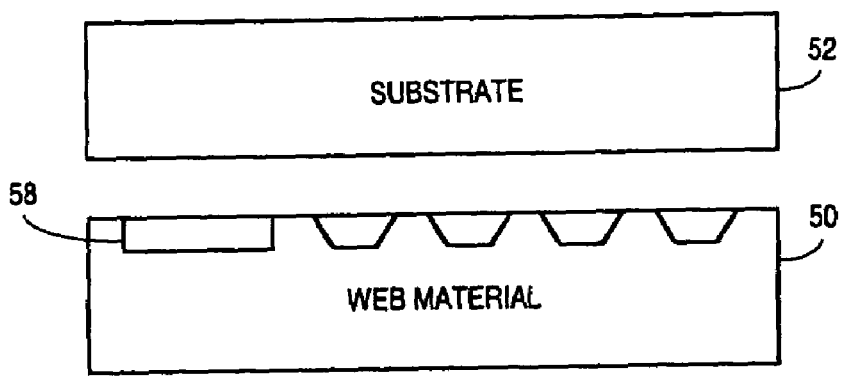
FIG. 5E shows the device in FIG. 5D and a substrate in accordance with one embodiment of the invention.
Figure 5F:
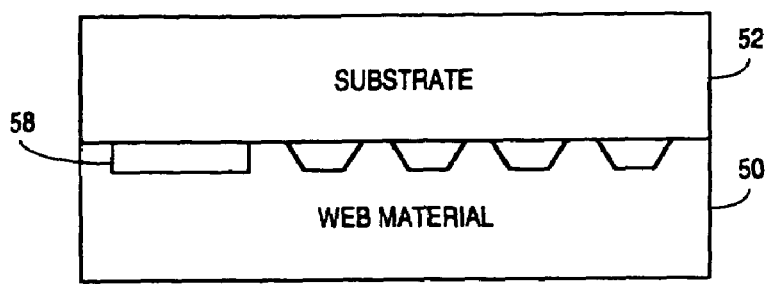
FIG. 5F shows the device in FIG. 5E wherein the web material is coupled to the substrate in accordance with one embodiment of the invention.
Figure 5G:
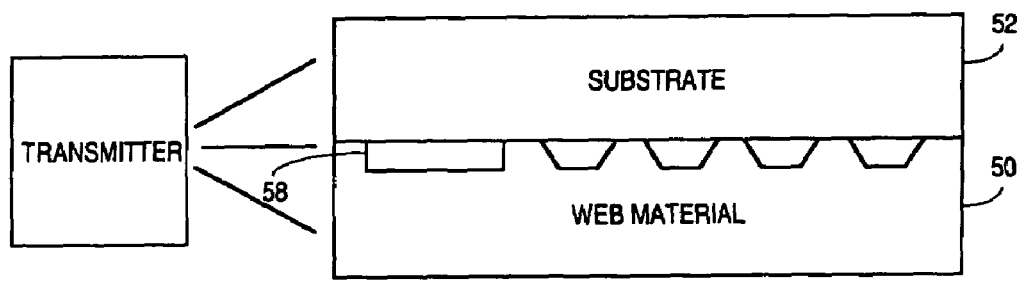
FIG. 5G shows a transmitter emitting signals to the device in FIG. 5F in accordance with one embodiment of the invention.

FIG. 5D shows blocks with integrated circuits thereon placed into recessed regions of the web material 50. The blocks are placed into the recessed regions by FSA or a deterministic method such as "pick and place." FIG. 5E shows a substrate 52 before it is coupled to the device in FIG. 5D. FIG. 5F shows substrate 52 coupled to web material 50 and receiver 58 in the web material. FIG. 5G shows a transmitter emitting signals to the receiver 58 of the device shown in FIG. 5F. The signal from the transmitter is received by a receiver on substrate 52. The receiver, coupled to the plurality of blocks, transmits the signal to the blocks. The blocks, in turn, cause the display to change.

FIG. 5G also shows a smart label (e.g., display) detecting a signal from a device (e.g. a transmitter, transceiver, etc.) that is capable of transmitting a signal. The device sending the signal may be portable or it may be an add-in board for a computer in which the transmitter is connected to a conventional bus. The data contained in a signal and received by a receiver in the smart label may contain such information as an address, a command, data related to updating information on a display, or any other data. The receiver then may amplify the signals that are either "1" or "0" and reconstructs the data into bit times. For example, a long bit time may represent "1" and a short bit time may represent "0". A controller, coupled to a display, may then compare an address in the signal with one stored in the controller itself. If the addresses match, the message is decoded. If there is not match between the addresses, the message is disregarded. It will be appreciated that the smart label may require a security code that must be first used in a first signal before a second signal may update the display. This will prevent an unscrupulous third party from sending a code that causes the display to change when there is no authorization to change the display.

A power source (not shown) such as a solar cell may be used to power a controller (not shown). The controller in turn may be used to power the blocks in the display. One embodiment of the invention involves incorporating a controller onto a block. This allows a portable device (e.g. transmitter or transceiver) to transmit signals directly to blocks on a smart label allowing the display to be updated. While FIG. 5G describes one method of powering a display, many other known methods also may be used.

Figure 6A:
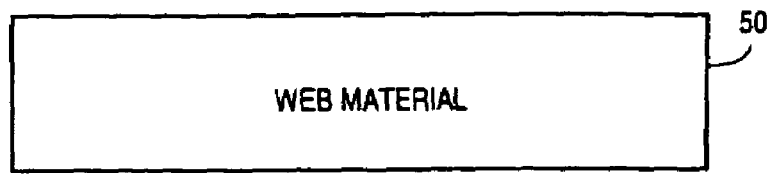
FIG. 6A shows a planar side view of web material in accordance with one embodiment of the invention.
Figure 6B:
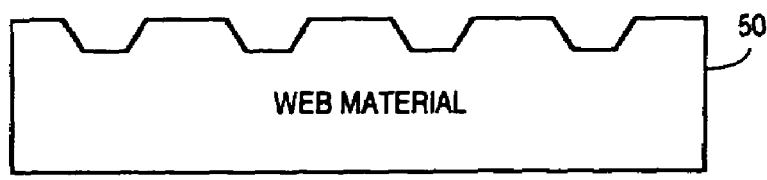
FIG. 6B shows a planar side view of web material with recessed regions created therein in accordance with one embodiment of the invention.
Figure 6C:
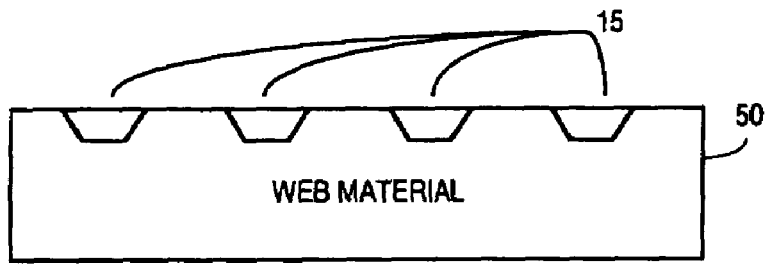
FIG. 6C shows a planar side view of web material with blocks placed in the recessed regions in accordance with one embodiment of the invention.
Figure 6D:
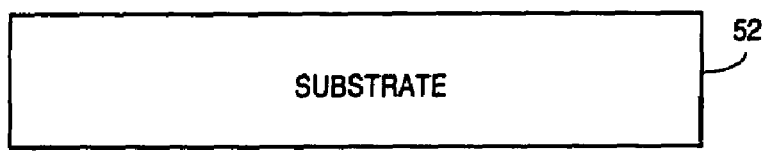
FIG. 6D shows a substrate approach the web material with blocks in accordance with one embodiment of the invention.
Figure 6D:
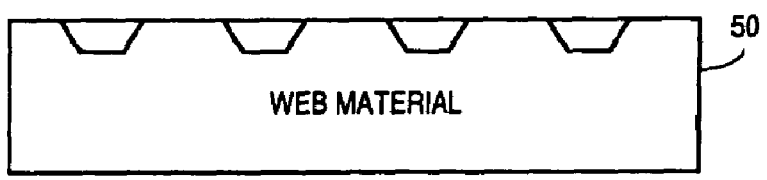
Figure 6E:
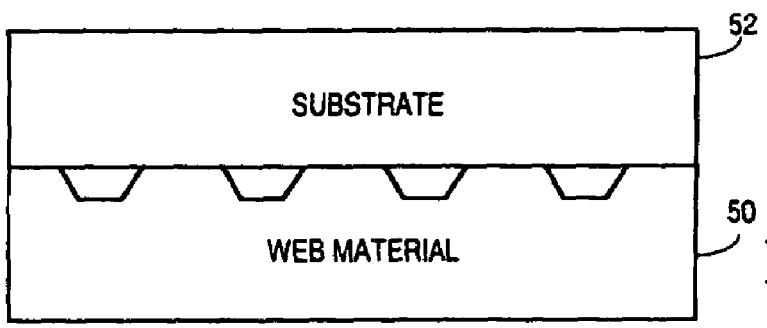
FIG. 6E shows a substrate coupled to the web material in accordance with one embodiment of the invention.
Figure 6F:
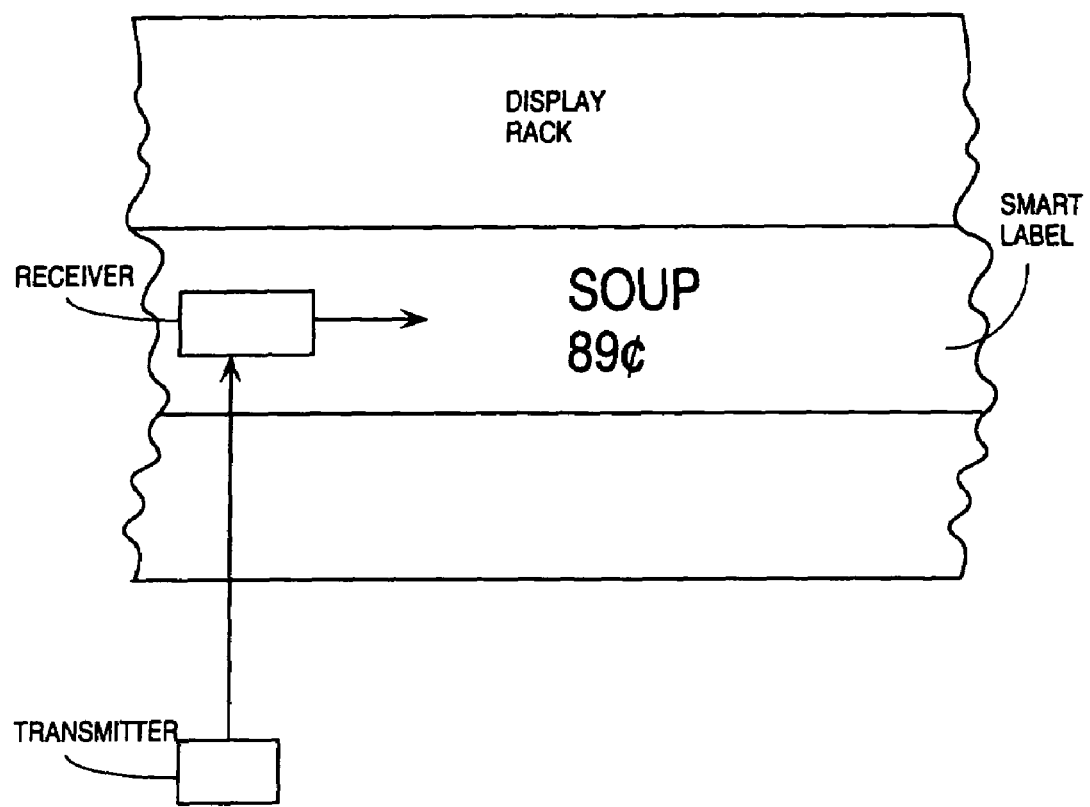
FIG. 6F shows the top view of a flexible display device wherein a substrate is coupled to a receiver and the flexible display device functions as a label in accordance with one embodiment of the invention.
Figure 6G:
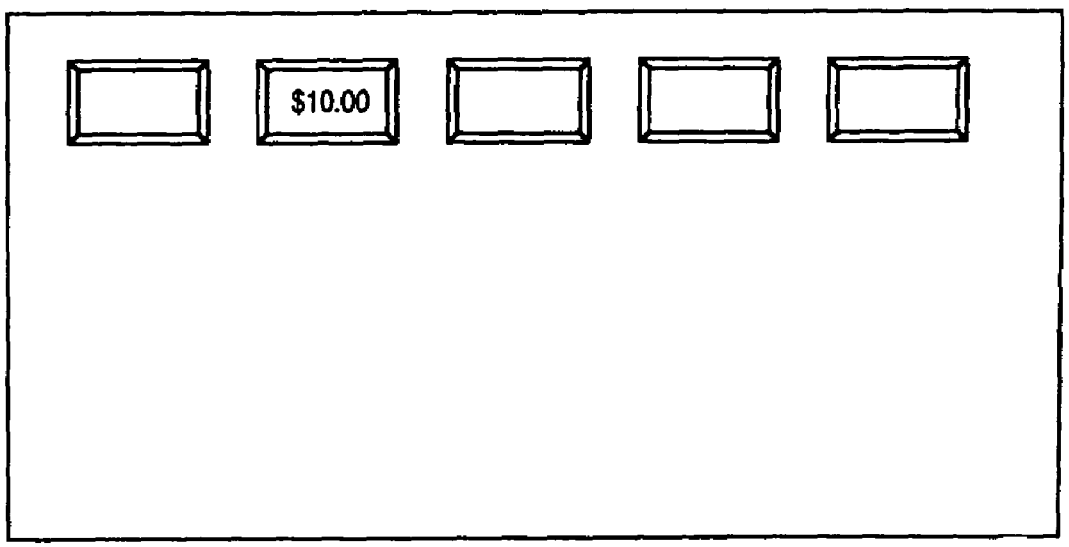
FIG. 6G shows smart labels used in the keys of a keyboard in accordance with one embodiment of the invention.

FIGS. 6A-6E show the assembly of another embodiment of a smart label in which a receiver is on each block. FIG. 6A shows a planar side view of web material 50. FIG. 6B shows a planar side view of web material with recessed regions created in the web material 50. FIG. 6C shows blocks 15 with electronic devices (e.g., integrated circuits, photocell, LED, capacitors, fuses, MEM sensor or other suitable device) thereon seated in the recessed regions or holes in the web material 50. FIG. 6D shows the substrate 52 before it is coupled to the web material 50. FIG. 6E shows the substrate 52 coupled to the web material 50. Bistable liquid crystal may be used in conjunction with the flexible substrate 52 to create a bistable liquid crystal cell between the substrate and the web material. Bistable liquid crystal allows the display to stay in such a state that there is no need to refresh the display and the display will remain in its last set state until new data is written into the display. A display of this type may be used in credit cards, labels in grocery stores, or any other type of card or label. Blocks are deposited onto the flexible substrate and are part of the active matrix display backplane. A block comprises an active circuit element (not shown) which drives a picture element (not shown). Blocks receive data as well as output data thereby creating a display. FIG. 6F shows the top view of a flexible display device wherein a substrate is coupled to a wireless receiver and to a label. FIG. 6G shows smart labels used in the keys of the keyboard. The keyboard may be attached to a computer or any other device which requires information to be inputted. By creating alterable displays on keys, the keypad may be may be electronically modified to reflect a foreign language such as French, German or Japanese. This reduces costs because the keyboard does not have to be physically replaced when using a dramatically different language.

Figure 7:
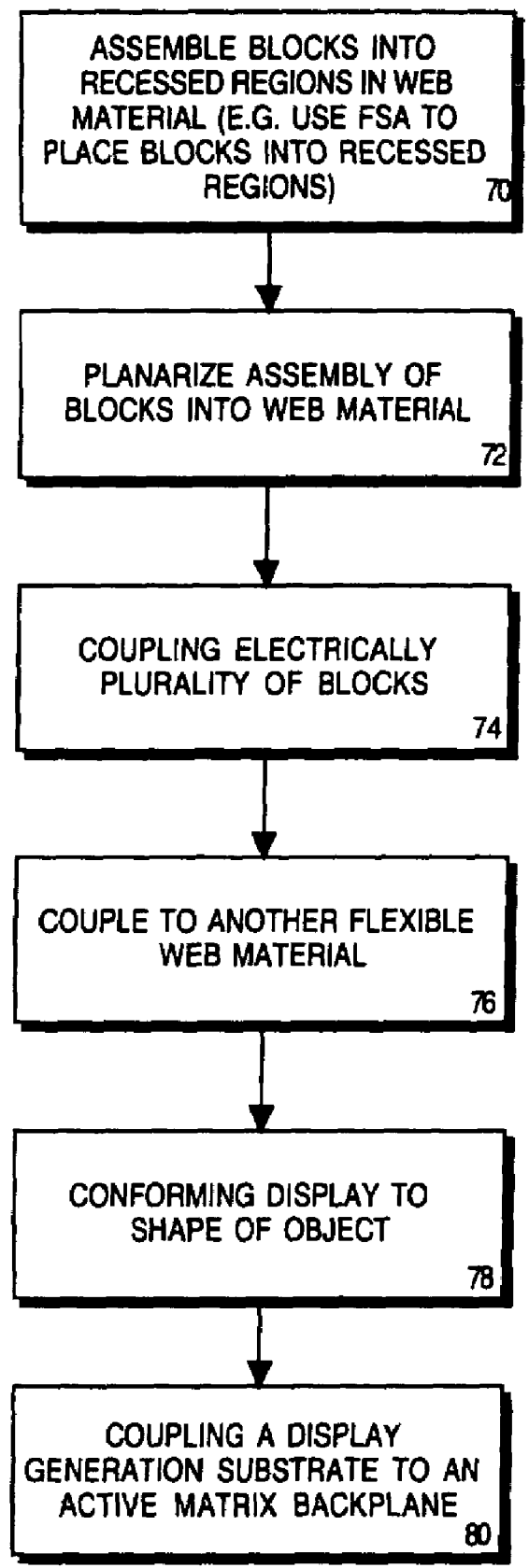
FIG. 7 shows a flow chart of the method of assembling a flexible display along the length of a flexible web material in accordance with one embodiment of the invention.

FIG. 7 shows one method of assembling a flexible display along the length of a flexible web material at operation 70 in accordance with an embodiment of the invention. Blocks are assembled into the openings of the flexible web material. Utilizing an FSA process, a plurality of blocks are deposited in a slurry. The slurry is then placed over a flexible substrate and the blocks go into the recessed regions of the flexible substrate.

Planarization of the assembly of blocks into web material 72 is the next operation. Extrusion bar coating is one of many methods that may be used to planarize web material. Then, the electrical coupling of the plurality of blocks takes place at operation 74 by opening holes in the planarization layer and depositing metalization material or other conductive materials into the holes and beyond the holes to form an interconnect (e.g., a row or column interconnect). The web material holding the plurality of blocks may then be coupled to another flexible layer such as web material at operation 76. The display is made to conform the object's shape at operation 78. The operation for forming the display may be done in a different order than that found in FIG. 7 and thus the operation 78 may be performed after operation 80. A display generation substrate (e.g., bistable liquid crystal, polymer-dispersed liquid crystal, or other material) is coupled to the active matrix backplane at operation 80.

Figure 8:
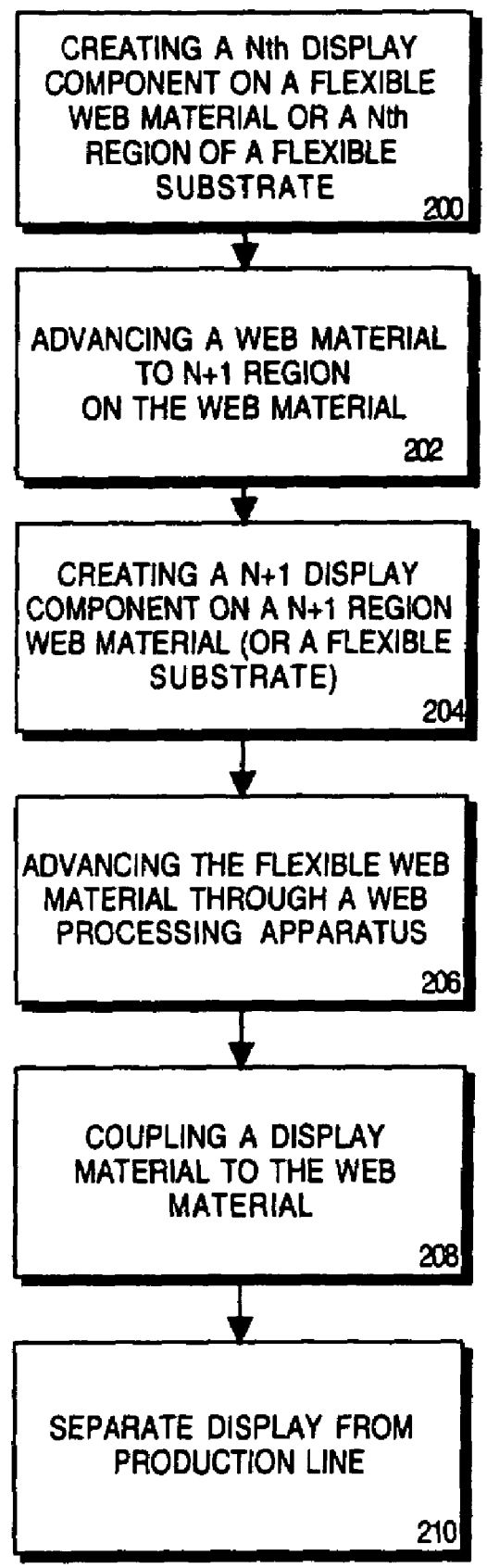
FIG. 8 shows a flow chart of the method of manufacturing multiple flexible displays along the length of a flexible web material in accordance with one embodiment of the invention.

FIG. 8 shows a method of manufacturing multiple displays along a flexible web material (or a flexible substrate). Multiple display components are created on a flexible web material at operation 200. The flexible web material is advanced to a second region on the web material at operation 202. A new display component is created on the flexible the web material in a different region of the web material at operation 204 by advancing the flexible web material through a web processing apparatus at operation 206 and coupling a display material to the web material at operation 208. Separation of the display panel occurs at the end of the process at operation 210.

Figure 9:
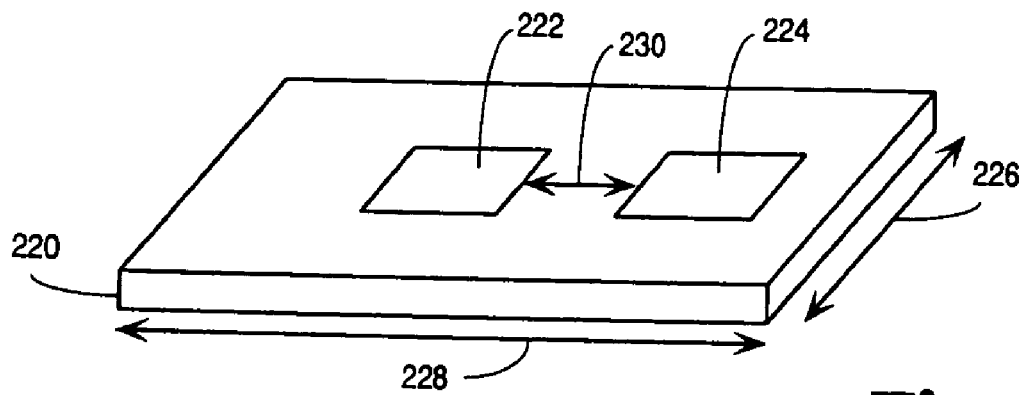
FIG. 9 shows a top view of a flexible web material with multiple display components fabricated thereon in accordance with one embodiment of the invention.

FIG. 9 shows a flexible web material with multiple display components that may be used to implement techniques of the invention. The flexible web material 220 has display component 222 and display component 224 attached thereto. The web material has three lengths: a first length 226, a second length 228, and a third length 230. Display components 222 and 224 are active matrix display devices.

Figure 10A:
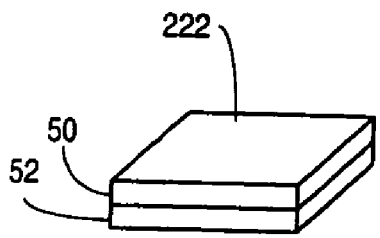
FIG. 10A shows a top view of a display component which has a passive matrix display backplane attached thereto in accordance with one embodiment of the invention.
Figure 10B:
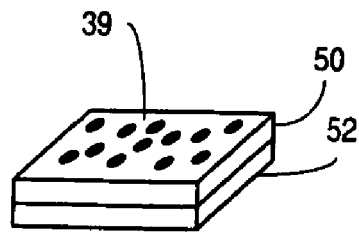
FIG. 10B shows a top view of a display component which has an active matrix display backplane attached thereto in accordance with one embodiment of the invention.

FIG. 10A shows display component 222 which has a passive matrix display backplane attached thereto which may be used in accordance with one embodiment of the invention. Substrate 52 is coupled to web material 50. FIG. 10B shows a display component 39 which has an active matrix display backplane attached thereto.

Figure 11:
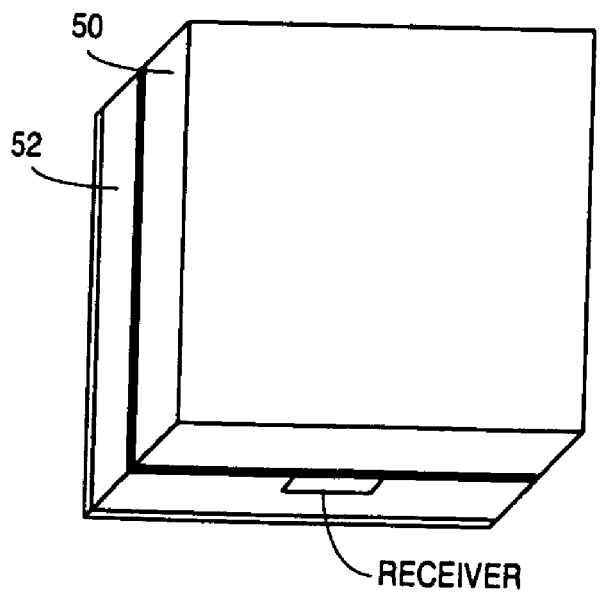
FIG. 11 shows a top view of flexible web material attached to a display backplane in accordance with one embodiment of the invention.

FIG. 11 shows a web material 50 coupled to flexible substrate 52, to a display backplane, and to a receiver 58 in accordance with one embodiment of the invention.

Figure 12A:
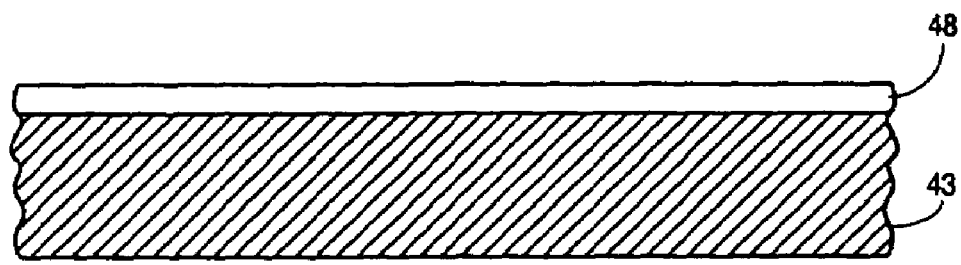
FIG. 12A shows a planar side view of a backplane interconnect layer coupled to a flexible web material in accordance with one embodiment of the invention.
Figure 12B:
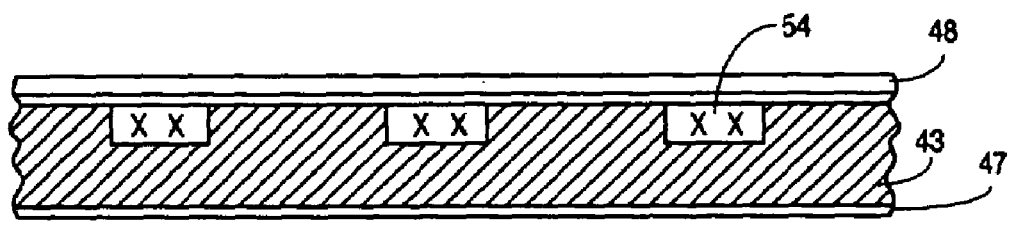
FIG. 12B shows a planar side view of a backplane interconnect layer coupled to a flexible web material wherein blocks are coupled to the backplane interconnect layer and to the flexible web material in accordance with one embodiment of the invention.
Figure 12C:
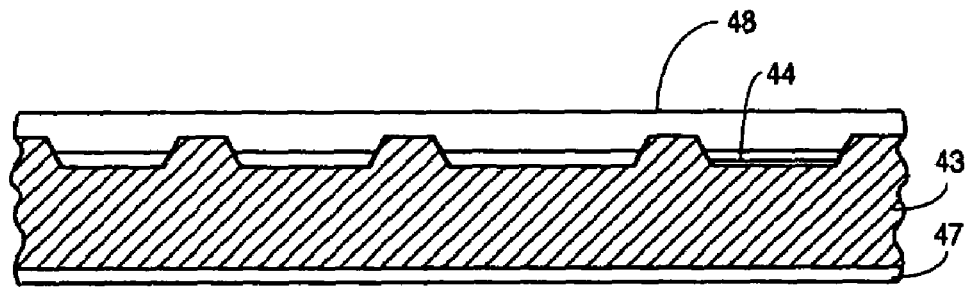
FIG. 12C shows a planar side view of a flexible reflective display coupled to a flexible web material which has holes or recesses to accept blocks in accordance with one embodiment of the invention.
Figure 12D:
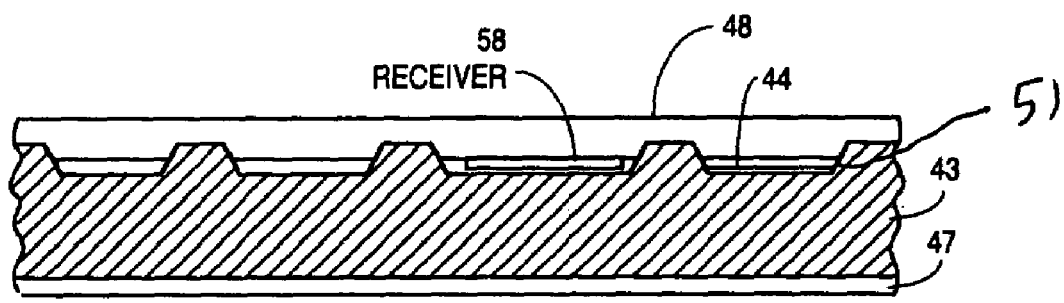
FIG. 12D shows a planar side view of a flexible reflective display coupled to a flexible web material which has holes or recesses to accept blocks and a transmitter emitting signals in accordance with one embodiment of the invention.

FIG. 12A shows a reflective display backplane 48 coupled to a flexible web material 43. FIG. 12B shows a flexible reflective display backplane 48 coupled to a web material 43 in which blocks 54 are coupled to the flexible web material 43 and to the flexible reflective display backplane 48. The reflective display backplane includes an interconnect layer 45. Interconnect layer 45 typically is comprised of metallic material or other conductive material. Coupled to the flexible web material 43 is a flexible reflector 47. FIG. 12C shows a flexible reflective display wherein recessed region 51 contains reflective material 44. The web material 43 is coupled to the reflective display backplane 48. FIG. 12D shows a receiver 58 coupled to the reflective display which forms a portion of the smart label. A second web material (not shown) is coupled to the device of FIG. 12D. This second web material has display material.

Figure 13A:
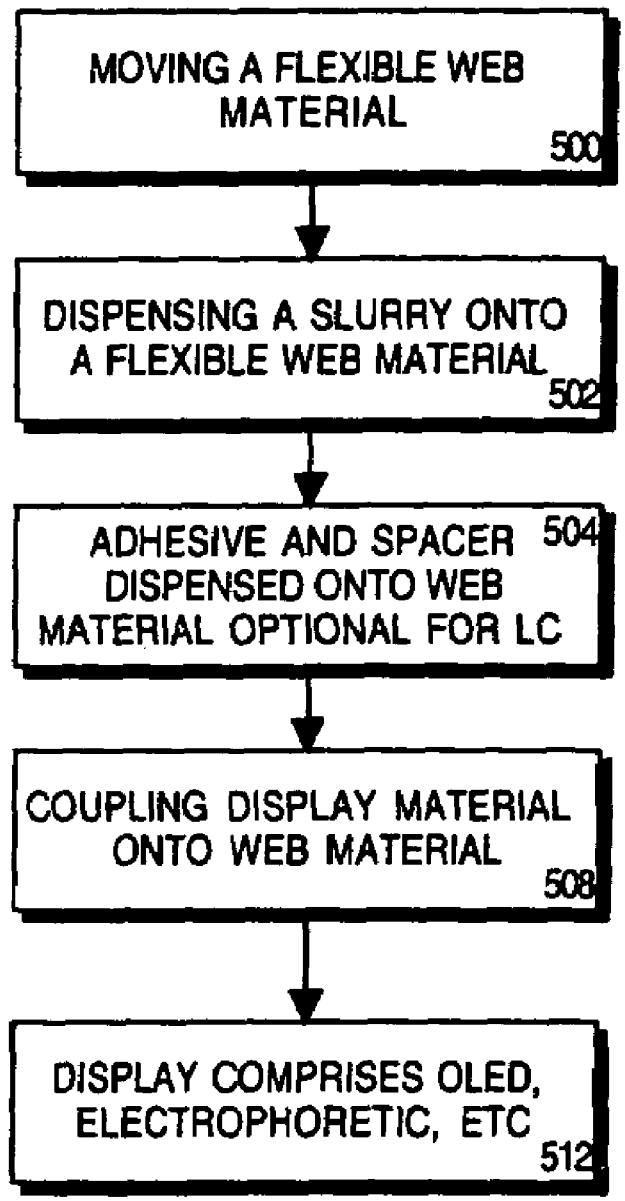
FIG. 13A shows a flow chart of a method of fabricating a display device wherein a flexible web material and a display tape undergo processing and are subsequently coupled in accordance with one embodiment of the invention.

FIG. 13A shows a method of fabricating a display device in which a flexible web material and a display tape undergo processing and are subsequently coupled. There, the flexible web material is advanced along a process line at operation 500. A slurry containing a plurality of blocks is dispensed onto the flexible web material at operation 502. A second slurry containing a plurality of blocks is again dispensed onto the web material. Excess slurry is collected in a container and is recycled. The blocks fall into recessed regions in the web material at operation 502. Adhesives and spacers are deposited onto the web material at operation 504. Display material is placed onto the web material at operation 508. This material may comprise bistable liquid crystal, polymer-dispersed liquid crystal, cholesteric liquid crystal, electrophoretic liquid crystal, upconverting phosphor, or downconverting phosphor at operation 512. Instead of placing blocks onto the web material, a substrate may be made to receive the blocks when creating the display. The web material may then be coupled to the substrate.

Figure 13B:
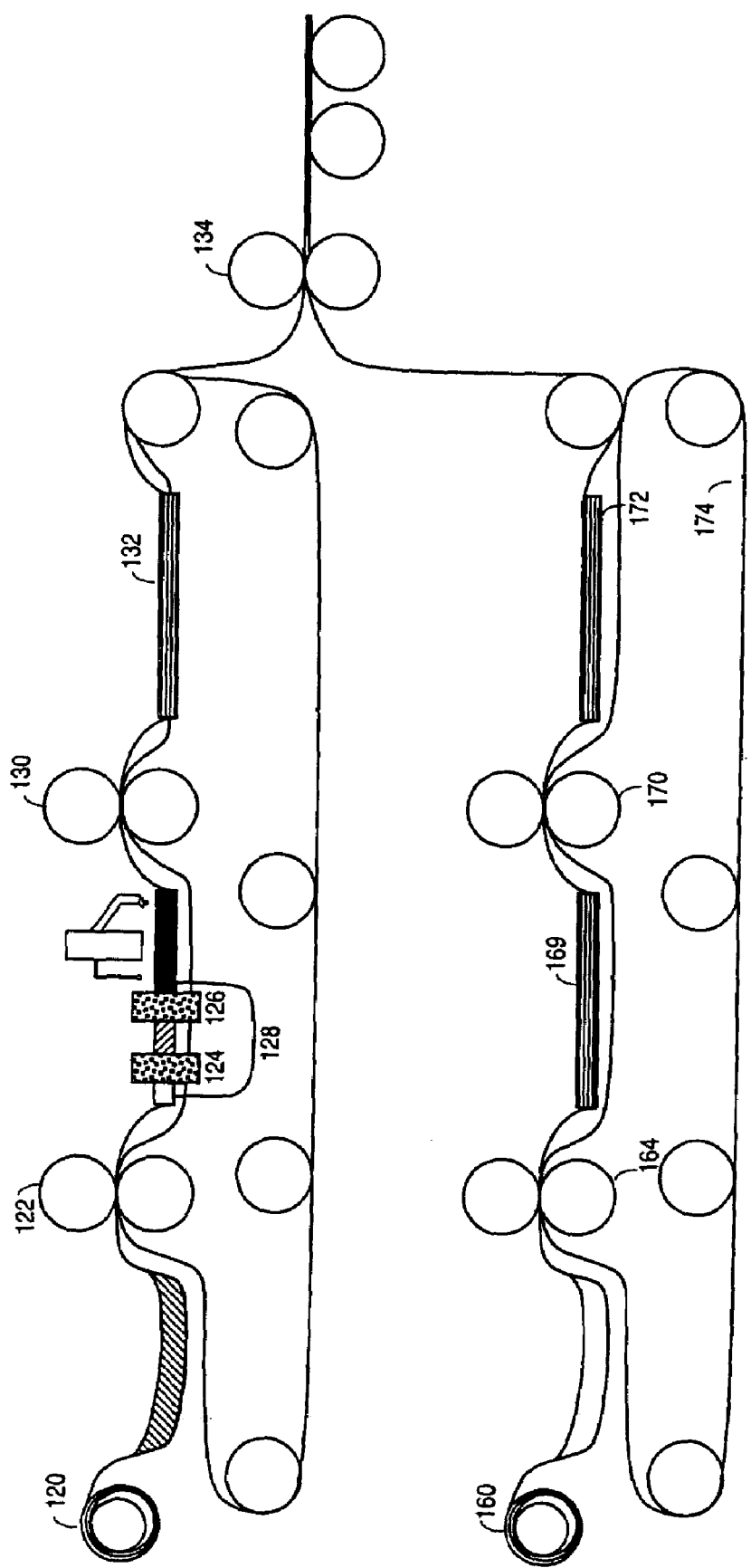
FIG. 13B shows a method of fabricating a display device wherein a flexible web material and a display tape undergo processing and are subsequently coupled in accordance with one embodiment of the invention.

FIG. 13B shows the overall process of fabricating a display device wherein a flexible web material 120 and a substrate 160 (or another web material) undergo processing and are subsequently coupled. There, the flexible web material is advanced along a first process line and advances through a first set of support members 122. A first slurry 124 containing a plurality of blocks is dispensed onto the flexible web material. A second slurry 126 containing a plurality of blocks is again dispensed onto the web material. Excess slurry is collected in a container 128 and is recycled. The blocks fall into recessed regions in the web material. Flexible web material 120 is advanced through a second set of support members 130. An interconnect 132 is then deposited onto flexible web material 120. The flexible substrate is then advanced to point 134. In conjunction with this process, substrate 160 undergoes a separate process. Display material is placed onto at least one side of the substrate 160. Substrate (or another web material) 160 is advanced through a first set of support members 164. The display material is patterned or layered 169. This display material may comprise polymer-dispersed liquid crystal, cholesteric liquid crystal, bistable liquid crystal, electrophoretic liquid crystal, upconverting phosphor, or downconverting phosphor. Substrate 160 is advanced through a second set of support members 170. An interconnect 172 is either deposited or etched onto the substrate 160. The substrate is then advanced to point 134 where the substrate is coupled to the web material. A conveyor belt 174 surrounds the support members. A PDLC layer may be used that can have indium tin oxide (ITO) attached thereto wherein they are laminated together; or, the ITO can be coupled to a substrate and sealed.

Figure 14:
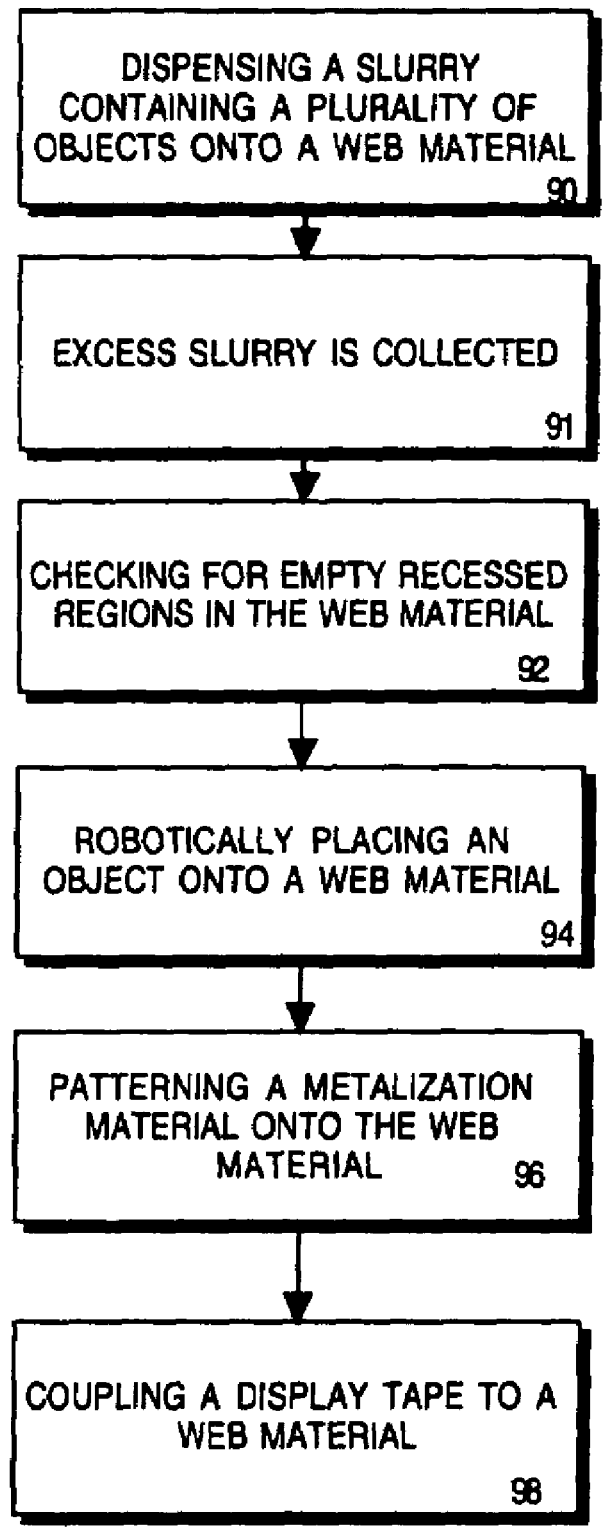
FIG. 14 shows a flow chart of a method of the picking and placing objects onto a flexible web material after the FSA process has been applied to the web material in accordance with one embodiment of the invention.

FIG. 14 relates to a method of picking and placing of objects onto a flexible web material after the FSA process has been applied to the web material. A slurry containing a plurality of objects is dispensed onto the web material at operation 90. The objects fall into recessed regions in the web material. The excess slurry is collected and recycled at operation 91. The web material is checked for empty recessed regions at operation 92. This checking is performed by an electronic eye which views the substrate. Objects are robotically placed into empty regions found in the web material at operation 94. A metalization material is placed onto at least one of the web material's surfaces and is patterned or etched at operation 96. The web material is coupled to the web material at operation 98.

Figure 15:
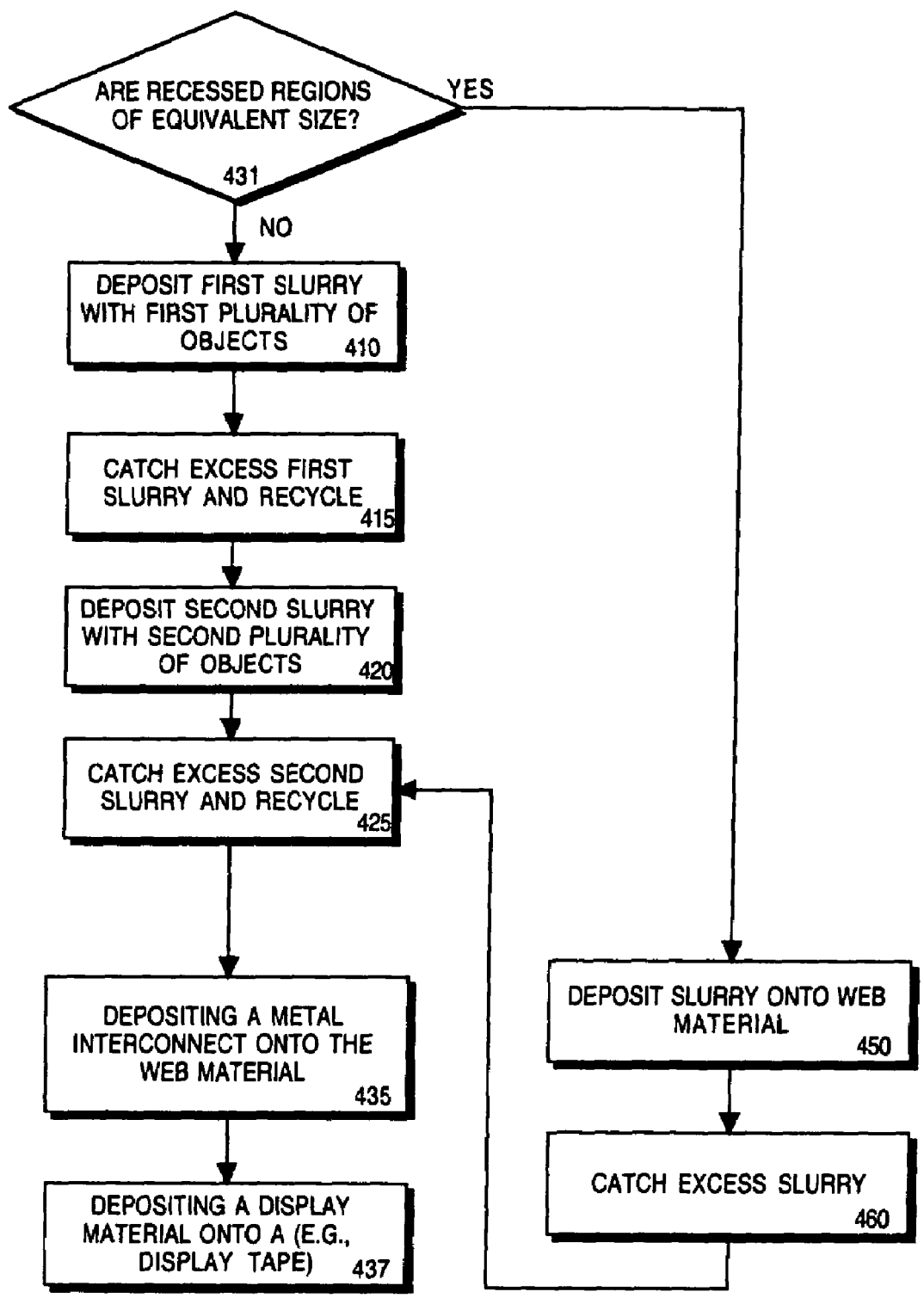
FIG. 15 shows a flow chart which relates to the FSA process and the coupling of the display material to the web material in accordance with one embodiment of the invention.

FIG. 15 relates to the FSA process and the coupling of the display material with the web material. At operation 431, a determination is made by an operator whether the recessed regions in the substrate are of equivalent size. A slurry containing a plurality of blocks is dispensed onto the web material at operation 410. If the recessed regions are of equivalent size, operation 450 is then followed. (At operation 450, a slurry containing a plurality of objects is disposed onto web material. The plurality of objects slide into recessed regions in the web material. The excess slurry is caught and recycled at operation 460.) If not, a first slurry with a first plurality of objects is deposited onto the web material at operation 410. Excess slurry is caught and recycled at operation 415. Once this step is performed, a second slurry with a second plurality of objects is placed onto the web material at operation 420. Excess second slurry is recycled into a second container at operation 425. A metal interconnect is then deposited onto the web material at operation 435. After these steps, a display material is deposited onto a display tape or a second web material at operation 437.

Figure 16:
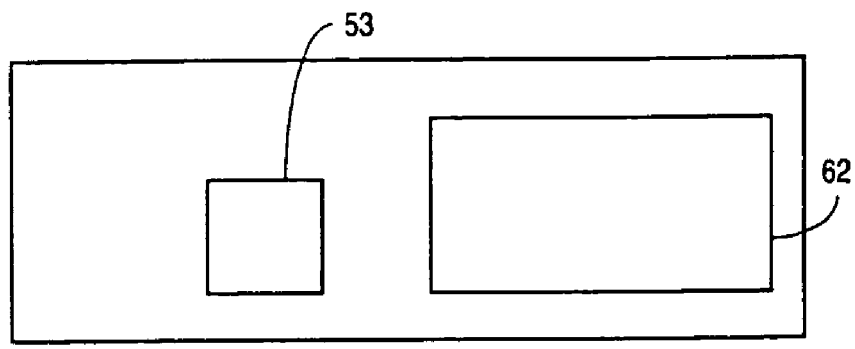
FIG. 16 shows a top view of a flexible continuous web material wherein displays of different sizes are created in accordance with one embodiment of the invention.
Figure 17:
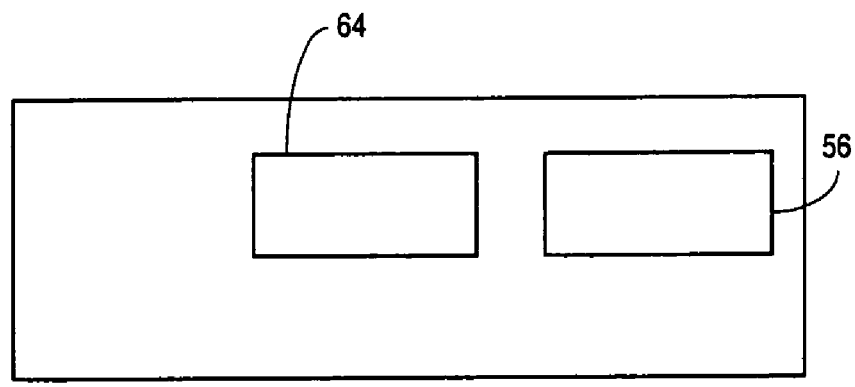
FIG. 17 shows a top view of a flexible continuous web material wherein displays of similar size are created in accordance with one embodiment of the invention.

FIG. 16 shows a flexible continuous web material wherein two displays are created. Display device 62 is larger than display device 53. This shows that multiple displays of different sizes can be created on the web material through an in-line process. Alternatively, FIG. 17 shows displays 64 and 56 of similar size.

Figure 18:
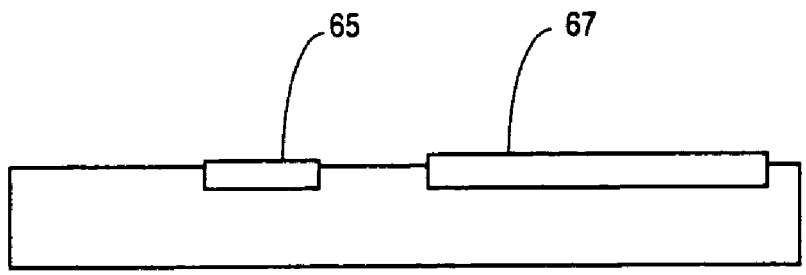
FIG. 18 shows a planar side view of the recessed regions in the web material in accordance with one embodiment of the invention.

In addition to multiple displays being able to be made different sizes, the web material itself may have different sized recessed regions. This allows the web material to receive various sized blocks or devices. FIG. 18 shows a cross-sectional view of the recessed regions in the substrate. Recessed region 65 is smaller than recessed region 67.

Figure 19:
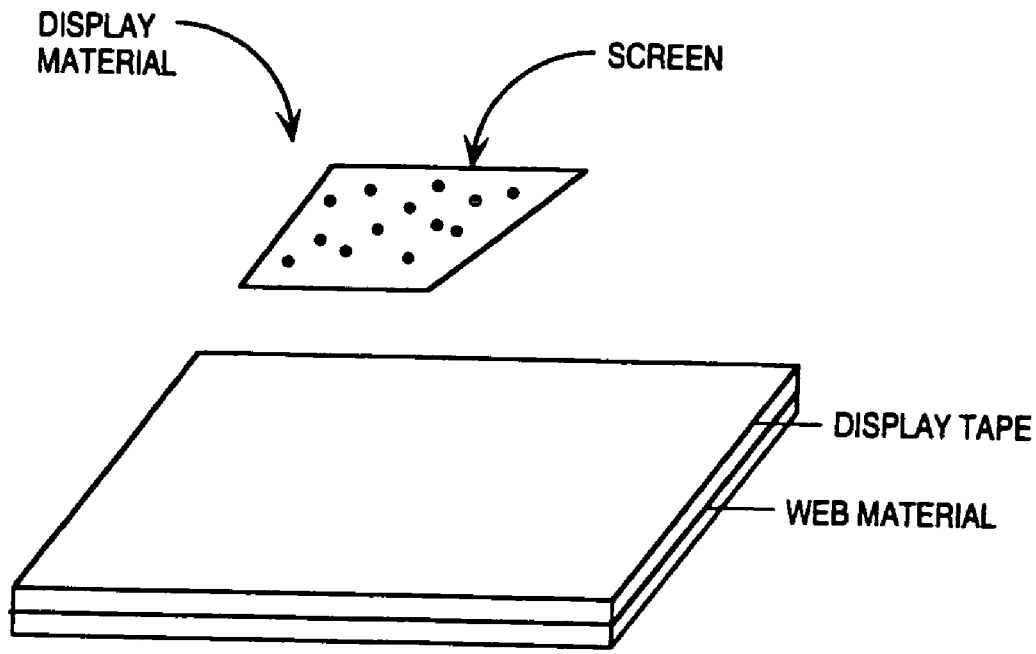
FIG. 19 shows a top view of display material being placed through a screen onto display tape in accordance with one embodiment of the invention.

FIG. 19 shows a display material being placed through a screen onto display tape. The screen has a desired pattern created by holes which go through the screen. This pattern may be dictated by a customer or by the manufacturer.

Figure 20:
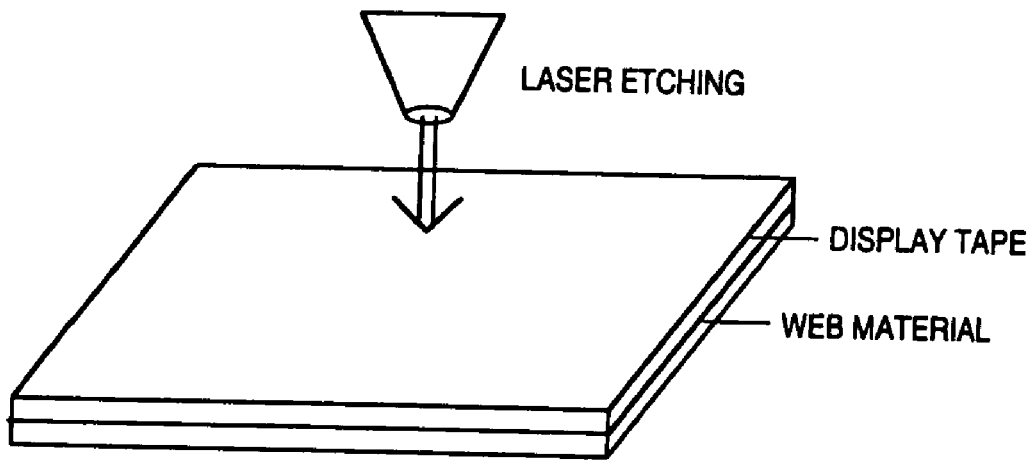
FIG. 20 shows a top view of display material being laser etched onto display tape in accordance with one embodiment of the invention.

Another method of placing display material onto the display tape is shown in FIG. 20. FIG. 20 shows a top view of display material being laser etched onto display tape. The etching occurs when the high intensity light from the laser strikes the display material on top of the display tape. A pattern is created in the display material by the laser.

Figure 21:
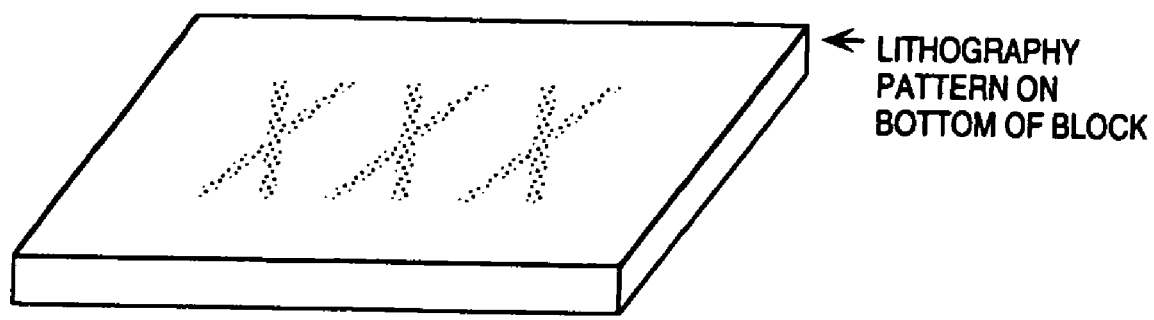
FIG. 21 shows a top view of display material wherein lithography is used to pattern the display material in accordance with one embodiment of the invention.

Another method of depositing display material is shown in FIG. 21. FIG. 21 shows lithography being used to pattern the display material. Lithography involves using a block with a pattern engraved in the bottom surface of the block. The bottom surface of the block contacts the display material.

Figure 22:
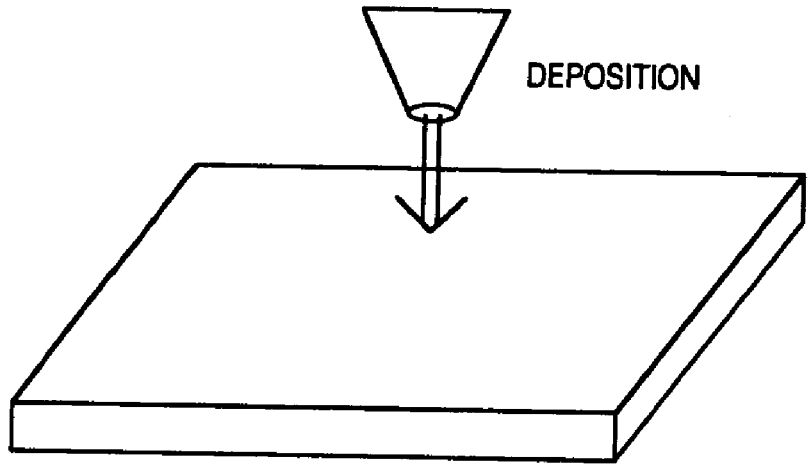
FIG. 22 shows a top view of display material which is deposited in a pattern onto display tape in accordance with one embodiment of the invention.

FIG. 22 shows yet another method of depositing display material onto the display tape. There display material is deposited in a pattern onto the display tape. The display material is deposited by a container which contains the display material. The container is placed over the display tape. The display material drops onto the display tape 168 in a pattern.

Figure 23A:
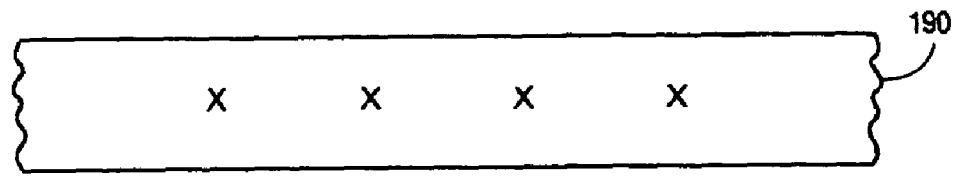
FIG. 23A shows a planar side view of a web material in accordance with one embodiment of the invention.
Figure 23B:
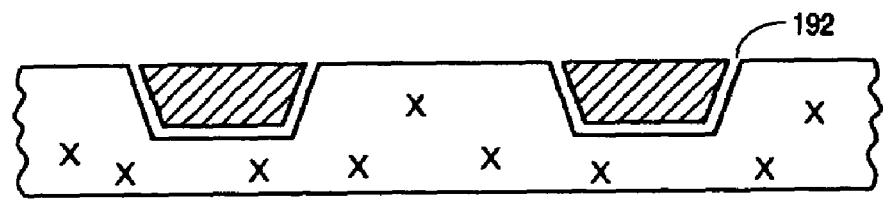
FIG. 23B shows openings or receptor regions created and blocks deposited into the web material in accordance with one embodiment of the invention.
Figure 23C:
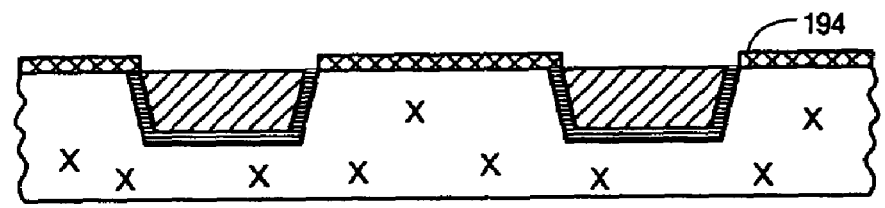
FIG. 23C shows deposition of planarization material and openings being created into the web material in accordance with one embodiment of the invention.
Figure 23D:
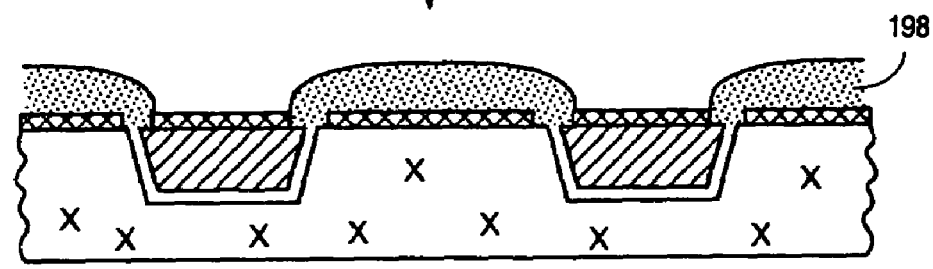
FIG. 23D shows deposition of interconnect and pattern interconnect in accordance with one embodiment of the invention.

FIGS. 23A-23D show generally the process of planarization material being added onto the web material (or flexible substrate if blocks are placed onto a flexible substrate instead of web material). Planarization of web material may occur through a variety of methods. One method involves using extrusion bar coating. FIG. 23A shows a planar side view of a web material 190. FIG. 23B shows openings or receptor regions 192 created and blocks deposited into the web material. FIG. 23C shows deposition of planarization material 194 and openings being created into the web material. FIG. 23D shows deposition of interconnect 198 and pattern interconnect.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

Listed below is a related U.S. Patent describing methods and devices that may be used in the invention described herein. This U.S. Patent is incorporated by reference. Additionally, previously filed patent applications are also incorporated by reference. These patent applications are also incorporated by reference.

U.S. Pat. No. 5,545,291 entitled "Method for Fabricating Self-Assembling Microstructures," filed by John S. Smith and His-Jen J. Yeh, issued Aug. 13, 1996.

Co-pending U.S. patent application Ser. No. 09/270,146 entitled "Apparatuses and Methods for Forming Assemblies," filed by Jeffrey J. Jacobsen and assigned to the same Assignee as the present invention, describes a method and apparatus of assembling flexible displays. This co-pending application is hereby incorporated herein by reference.

U.S. patent application Ser. No. 09/270,157 entitled "Methods for Transferring Elements From A Template To A Substrate" (now U.S. Pat. No. 6,555,408), filed by Jeffrey J. Jacobsen, Mark A. Hadley, and John Stephen Smith and assigned to the same Assignee of the present invention, describe an FSA on a template with transfer to another substrate. These applications are hereby incorporated herein by reference.

U.S. patent application Ser. No. 09/270,159 entitled "Methods and Apparatuses for Fabricating A Multiple Module Assembly" (now U.S. Pat. No. 6,316,278), filed by Jeffrey J. Jacobsen, Glenn Wilhelm Gengel, and Gordon S. W. Craig and assigned to the same Assignee as the present invention, describes an electronic modular assembly. This application is hereby incorporated herein by reference.

U.S. patent application Ser. No. 09/270,147 entitled "Apparatuses and Methods Used in Forming Electronic Assemblies" (now U.S. Pat. No. 6,274,508), filed by Jeffrey J. Jacobsen, Glenn Wilhelm Gengel, and John Stephen Smith and assigned to the same Assignee as the present invention, describes a method of molding substances. This co-pending application is hereby incorporated herein by reference.

U.S. patent application Ser. No. 09/270,165 entitled "Apparatuses and Methods for Forming Assemblies" (now U.S. Pat. No. 6,281,038), filed by Jeffrey J. Jacobsen and assigned to the same Assignee as the present invention, describes a method of rolling blocks into their recessed regions. This application is hereby incorporated herein by reference.

U.S. patent application Ser. No. 09/932,409 entitled "Apparatuses and Methods for Forming Assemblies" (now U.S. Pat. No. 6,683,663), filed by Mark A. Hadley, Ann Chiang, Gordon Craig, Jeffrey Jay Jacobsen, John Stephen Smith, Jay Tu, and Roger Stewart and assigned to the same Assignee as the present invention, describes a relocating tool capable of moving a plurality of blocks from a first substrate to a second substrate.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method for manufacturing an RF transponder label comprising:
   placing a plurality of integrated circuit chips onto a flexible web material, the integrated circuit chips each being a wireless RF transponder device;
   advancing the flexible web material through a web processing apparatus that performs a continuous web process;
   patterning a metallization material onto the flexible web material to form interconnects for each wireless RF transponder device;
   separating the flexible web material; and
   coupling the flexible web material to a second web material in a further continuous web process and wherein the placing is performed by a robotic arm.

2. The method of claim 1 further comprising viewing the surface of the flexible web material with an electronic eye to check for empty recessed regions.

3. The method of claim 1 further comprising laser etching the flexible web material.

4. The method of claim 1 wherein the metallization material includes at least one of a conductive polymer, conductive oxide, aluminum, copper, silver, gold, metal particles, and teflon with metallic particles.

5. The method of claim 1 wherein the integrated circuit chips are configured to be powered by a signal from a transmitter.

6. The method of claim 5 wherein the transmitter is a portable device.

7. The method of claim 1 wherein the RF transponder comprises a flexible antenna.

8. The method of claim 1 wherein a length of the flexible material is more than ten times greater than a width of the flexible material.

9. The method of claim 1 wherein the integrated circuit chips include at least one of detector, comparator, bias generator, and plurality of amplifiers.

10. The method of claim 1 wherein the RF transponder further comprises a photo-voltaic cell.

11. The method of claim 1 wherein the integrated circuit chip requires a security code before an update.

12. The method of claim 1 wherein the integrated circuit chip is configured to compare an address in a received signal to an address stored in the integrated circuit chip.

13. A method for manufacturing an RF transponder comprising:
    viewing a surface of a flexible web material with an electronic eye;
    placing with a robotic arm a plurality of integrated circuit chips onto the surface of the flexible web, the integrated circuit chips each being a wireless RF transponder device;
    advancing the flexible web material through a web processing apparatus that performs a continuous web process;
    patterning a conductive material onto the flexible web material to form interconnects for each wireless RF transponder device;
    separating the flexible web material; and
    coupling the flexible web material to a second web material in a further continuous web process.

14. A method for manufacturing an RF transponder comprising:
    placing a plurality of integrated circuit chips onto a web material, the integrated circuit chips each comprising a wireless RF transponder device being configured to be powered by a signal from a transmitter;
    advancing the web material through a web processing apparatus that performs a continuous web process;
    patterning a metallization material onto the web material to form interconnects for each wireless RF transponder device;
    separating the web material;
    and coupling the web material to a second web material in a further continuous web process and wherein the placing is performed by a robotic arm.

* * * * *